United States Patent
Saga et al.

[11] Patent Number: 5,679,171
[45] Date of Patent: Oct. 21, 1997

[54] METHOD OF CLEANING SUBSTRATE

[75] Inventors: Koichiro Saga; Sakuo Koyata; Takeshi Hattori, all of Kanagawa, Japan

[73] Assignee: Sony Corporation, Japan

[21] Appl. No.: 611,673

[22] Filed: Mar. 6, 1996

[30] Foreign Application Priority Data

Mar. 27, 1995 [JP] Japan .................................. 7-068335

[51] Int. Cl.$^6$ .............................. C03C 23/00; B08B 3/00
[52] U.S. Cl. ........................ 134/3; 134/2; 134/26; 134/28; 134/29
[58] Field of Search ........................ 134/2, 1.3, 26, 134/3, 28, 29, 27

[56] References Cited

U.S. PATENT DOCUMENTS

| | | | |
|---|---|---|---|
| 4,795,497 | 1/1989 | McConnell | 134/18 |
| 4,921,572 | 5/1990 | Roche | 139/2 |
| 5,454,901 | 10/1995 | Tsuji | 134/3 |
| 5,487,398 | 1/1996 | Ohmi et al. | 134/95.1 |
| 5,571,375 | 11/1996 | Izumi et al. | 134/3 |

Primary Examiner—Robert J. Warden
Assistant Examiner—Alexander Markoff
Attorney, Agent, or Firm—Ronald P. Kananen

[57] ABSTRACT

A method of cleaning the surface of a substrate, wherein the first step of the process of cleaning the substrate including a step of cleaning the surface of the substrate by an acidic solution, oxidizing solution, or alkaline solution, comprises a step of removing the natural oxide film formed on the surface of the substrate.

13 Claims, 4 Drawing Sheets

5,679,171

METHOD OF CLEANING SUBSTRATE

BACKGROUND OF THE INVENTION

1. Field of the Invention

The present invention relates to a method of cleaning a substrate, more particularly relates to a method of cleaning a substrate which enables the organics or inorganics or other contaminants adhering to the surface of the substrate to be effectively removed from the substrate surface.

2. Description of the Related Art

In the process of production of a semiconductor device, contamination can occur having a detrimental effect on the operating characteristics of the semiconductor device. One type of contamination is the minute amount of organics adsorbed on the surface of the silicon substrate. This minute amount of organics ends up adsorbed to the surface of the semiconductor device even when just allowing the silicon substrate to stand in a dust-free atmosphere or plastic box.

In the cleaning methods of the related art, it is not possible to effectively remove the minute amount of organics adsorbed to the surface of the silicon substrate. Therefore, the minute amount of organics which could not be removed remain on the surface of the silicon substrate and suffers from the disadvantage on production.

SUMMARY OF THE INVENTION

An object of the present invention is to provide a method of cleaning a substrate enabling removal of even the minute amount of adsorbed organics present on the substrate surface.

To achieve the above object, the present invention provides a method of cleaning the surface of a substrate wherein the first step of the process of cleaning the substrate, including a step of cleaning the surface of the substrate by an acidic solution, oxidizing solution, or alkaline solution, is a step of removing the natural oxide film formed on the surface of the substrate.

Preferably, the natural oxide film is removed by immersing the substrate in a solution containing hydrofluoric acid. The solution containing hydrofluoric acid may be a hydrofluoric acid solution of a concentration of 0.5 percent by weight and the time of immersion may be approximately i minute. Alternatively, the solution containing hydrofluoric acid may be a buffered hydrofluoric acid solution containing hydrofluoric acid and ammonium fluoride. In this case, the buffered hydrofluoric acid solution preferably is comprised of 0.1 percent by weight of hydrofluoric acid and 60 percent by weight of ammonium fluoride.

Preferably, the alkaline solution is comprised of ammonia, hydrogen peroxide, and pure water.

Alternatively, the natural oxide film may be removed by exposing the substrate in a vapor containing hydrofluoric acid. In this case, preferably the vapor containing hydrofluoric acid is a vapor of a buffered hydrofluoric acid containing hydrofluoric acid and ammonium fluoride. Preferably, the vapor of the buffered fluoride acid is formed by heating an aqueous solution of 0.1 percent by weight of hydrofluoric acid and 60 percent by weight of ammonium fluoride. In this case, the pressure of the vapor of the buffered hydrofluoric acid is preferably made ordinary pressure and the silicon substrate is preferably exposed in the vapor containing the buffered hydrofluoric acid for 0.5 to approximately 1 minute.

Preferably, after the step of removing the natural oxide film, there are further provided a step of cleaning by an alkaline solution and a step of cleaning by an acidic solution.

BRIEF DESCRIPTION OF THE DRAWINGS

These and other objects and features of the present invention will become apparent from the following description of the preferred embodiments made with reference to the attached drawings, in which.

DESCRIPTION OF THE PREFERRED EMBODIMENTS

Before describing the present invention, a brief explanation will be made of one of the related arts by way of reference.

Figure 1:
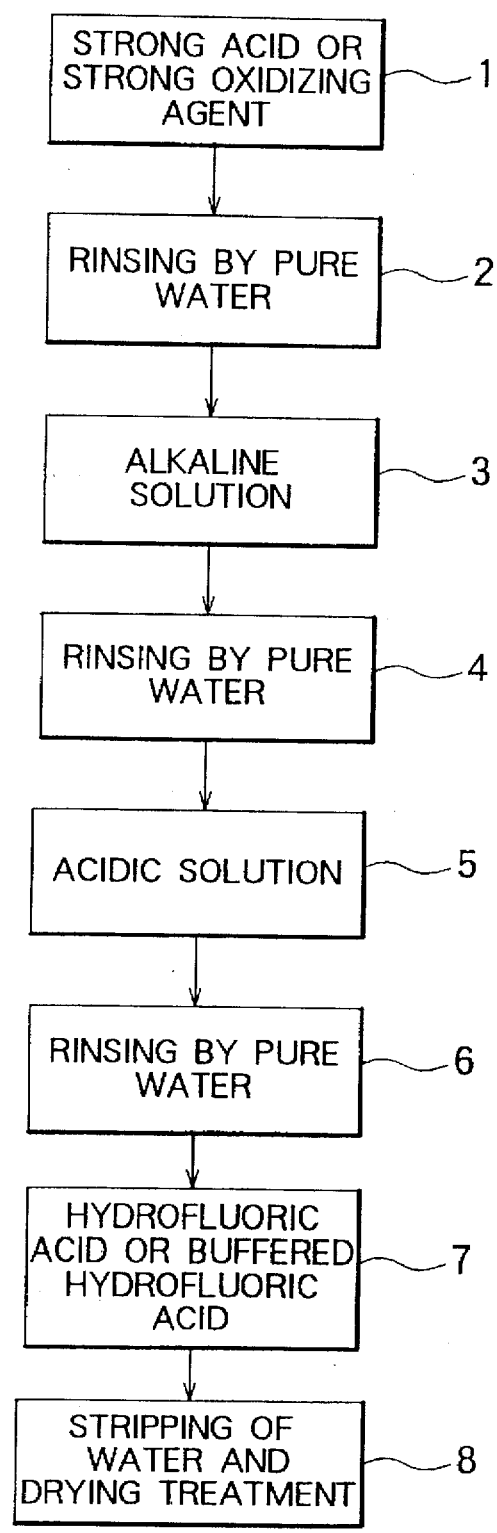
FIG. 1 is a flow chart of the method of cleaning a silicon substrate according to the related art.

The surface of silicon substrates has been cleaned in the related art by the process shown in the flow chart of FIG. 1.

As shown in FIG. 1, first, at step 1, the surface is cleaned using a strong acid or a strong oxidizing agent (sulfuric acid+hydrogen peroxide, fuming nitric acid, ultra-pure water with ozone, etc.) for the purpose of removing the organics from the surface of the silicon substrate. Next, at step 2, pure water is used to rinse the surface to wash off the cleaning solution of the previous step, then at step 3 the surface is cleaned using an alkaline cleaning solution (ammonia+hydrogen peroxide +pure water).

Next, at step 4, the surface is rinsed and cleaned with pure water to wash off the cleaning solution of the previous step, then at step 5 the surface is cleaned using an acidic cleaning solution (hydrochloric acid+hydrogen peroxide+pure water etc.) for the purpose of removing the heavy metals. Next, at step 6, the surface is rinsed and cleaned by pure water to wash off the cleaning solution of the previous step, then at step 7, the surface is wet etched using hydrofluoric acid or buffered hydrofluoric acid for the purpose of removing the natural oxide film formed on the silicon substrate surface by the cleaning solution. Next, at step 8, the surface of the silicon surface is stripped of water and dried.

In the cleaning method of the above related art, however, the present inventors found by experiments that it was not possible to effectively remove the minute amount of organics adsorbed to the surface of the silicon substrate. That is, while it was possible to reduce the large amount of adsorbed organics to a minute amount by the cleaning by the strong acid or strong oxidizing agent applied first in the above cleaning method of the related art, it was not possible to reduce the minute amount of the adsorbed organics to substantially close to zero.

Note that in the process of the related art, the treatment by the hydrofluoric acid or buffered hydrofluoric acid was performed as a later step of the cleaning by the acidic solution, but this treatment was for removing the oxide film formed on the surface of the silicon by the cleaning by the oxidizing solution. Therefore, the minute amount of organics which could not be removed by the strong acid or strong oxidizing agent remains on the surface of the silicon substrate even after the stripping and drying treatment of step 8 and becomes a problem in production.

The present invention provides a method of cleaning the surface of a substrate wherein the first step of the process of cleaning the substrate including a step of cleaning the surface of the substrate by an acidic solution, oxidizing solution, or alkaline solution, comprises a step of removing the natural oxide film formed on the surface of the substrate.

The natural oxide film is removed by immersing the substrate in a solution containing hydrofluoric acid or exposing the substrate in vapor containing hydrofluoric acid. As the solution containing the hydrofluoric acid, use may be made of an aqueous solution of hydrofluoric acid, a buffered hydrofluoric acid solution containing hydrofluoric acid and ammonium fluoride, etc. As the vapor containing the hydrofluoric acid, use may be made of a vapor of an aqueous solution of hydrofluoric acid, a vapor of a buffered hydrofluoric acid containing hydrofluoric acid and ammonium fluoride, etc.

When using a hydrofluoric acid, the concentration of the hydrofluoric acid is preferably at least 0.1 percent by weight and the treatment time is for example 30 seconds to 3 minutes. When using a buffered hydrofluoric acid, the concentration of the hydrofluoric acid is 0.05 to 10 percent by weight. The ratio of weight of the ammonium fluoride ($NH_4F$) to the hydrofluoric acid (HF) is about 1:200 to 600. The treatment time is for example 30 seconds to 3 minutes.

After the step of removing the natural oxide film, at least a step of cleaning by an alkaline solution and a step of cleaning by an acidic solution are performed.

The substrate to be cleaned by the method of cleaning of the present invention is not particularly limited, but for example, may be a silicon substrate, gallium arsenide substrate, or other semiconductor substrate or other substrate.

In the method of cleaning a substrate according to the present invention, the first step of cleaning is to remove the natural oxide film formed on the surface of the substrate by hydrofluoric acid, buffered hydrofluoric acid, etc., so it is possible to effectively remove the minute amount of organics and inorganics adsorbed on the natural oxide film.

Next, it is possible to remove the particulates on the substrate surface by cleaning by an alkaline solution (ammonia+hydrogen peroxide+pure water). Further, it is possible to remove the heavy metals on the surface of the substrate by cleaning by an acidic solution (hydrochloric acid+hydrogen peroxide+pure water etc.)

When cleaning the substrate by the acidic solution, an oxide film is sometimes formed on the surface of the substrate, but this film can be removed by a final step of wet etching by hydrofluoric acid, buffered hydrofluoric acid, etc.

As a result, it is possible to substantially completely remove the organics adsorbed on the surface of the substrate before cleaning and possible to easily obtain a substrate with excellent surface conditions. That is, the method of cleaning of the present invention enables one to obtain an extremely clean semiconductor wafer or other substrate, eliminates the contamination by the minute amount of organics in the later film-forming, etching, exposure, and other processes, and thereby enables production of extremely high quality semiconductor devices with a good yield.

In particular, silicon wafers and other substrates are sometimes placed in plastic boxes for storage or transportation etc. The plasticizers, cross-linking agents, antioxidants, etc. contained in the plastic sometimes are absorbed on the oxide film on the surface of the substrates. In the method of cleaning of the related art, it had not been possible to effectively remove these minute amounts of organics from the substrate surface.

According to the method of cleaning of the present invention, it is possible to substantially completely remove the organics adsorbed on the surface of the substrates before cleaning. The minute amounts of organics able to be removed by the method of the present invention are not particularly limited, but include, for example, substances easily adhering to natural oxide films such as diacetylbenzene and other cross-linking agents, dibutyl phthalate (DBP), dioctyl phthalate, and other plasticizers, di-tertiary-butyl-p-cresol (BHT), and other antioxidants.

The method of cleaning a substrate according to the present invention will be explained in further detail below based on the embodiments shown in the figures.

Figure 2:
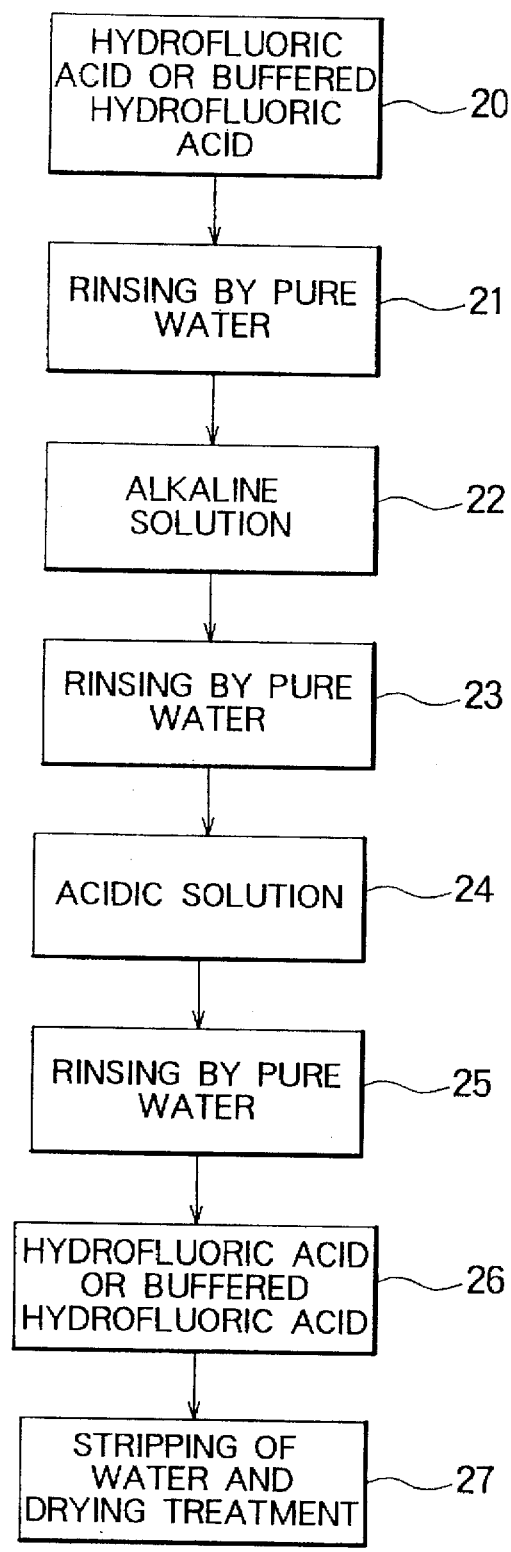
FIG. 2 is a flow chart of the method of cleaning a silicon substrate according to an embodiment of the present invention.
Figure 3A:
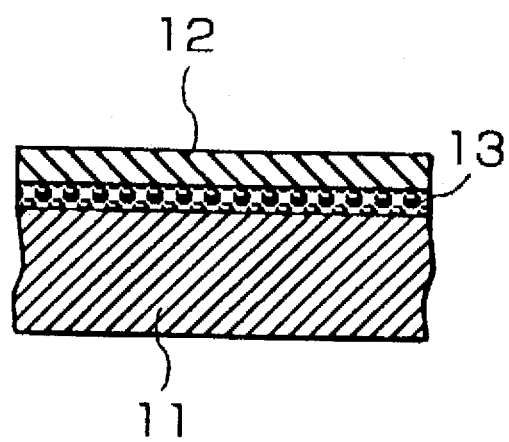
FIGS. 3A to 3D are schematic cross-sectional views of the state of the surface of a substrate at the steps of the method of cleaning a silicon substrate according to an embodiment of the present invention.
Figure 3B:
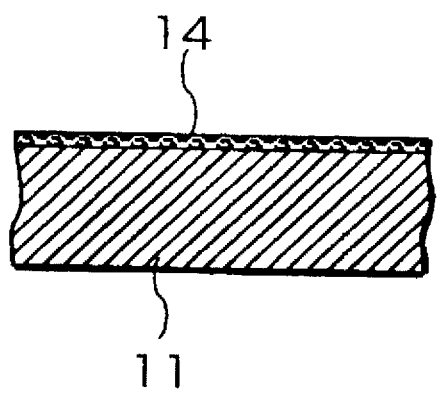
Figure 3C:
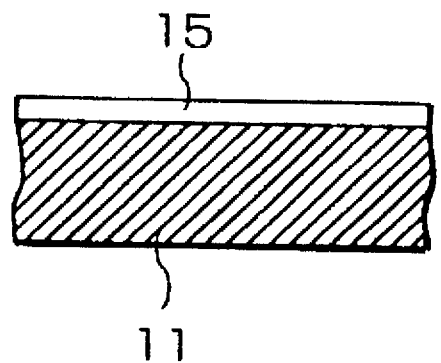
Figure 3D:
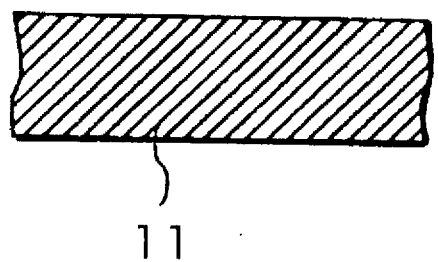
Figure 4:
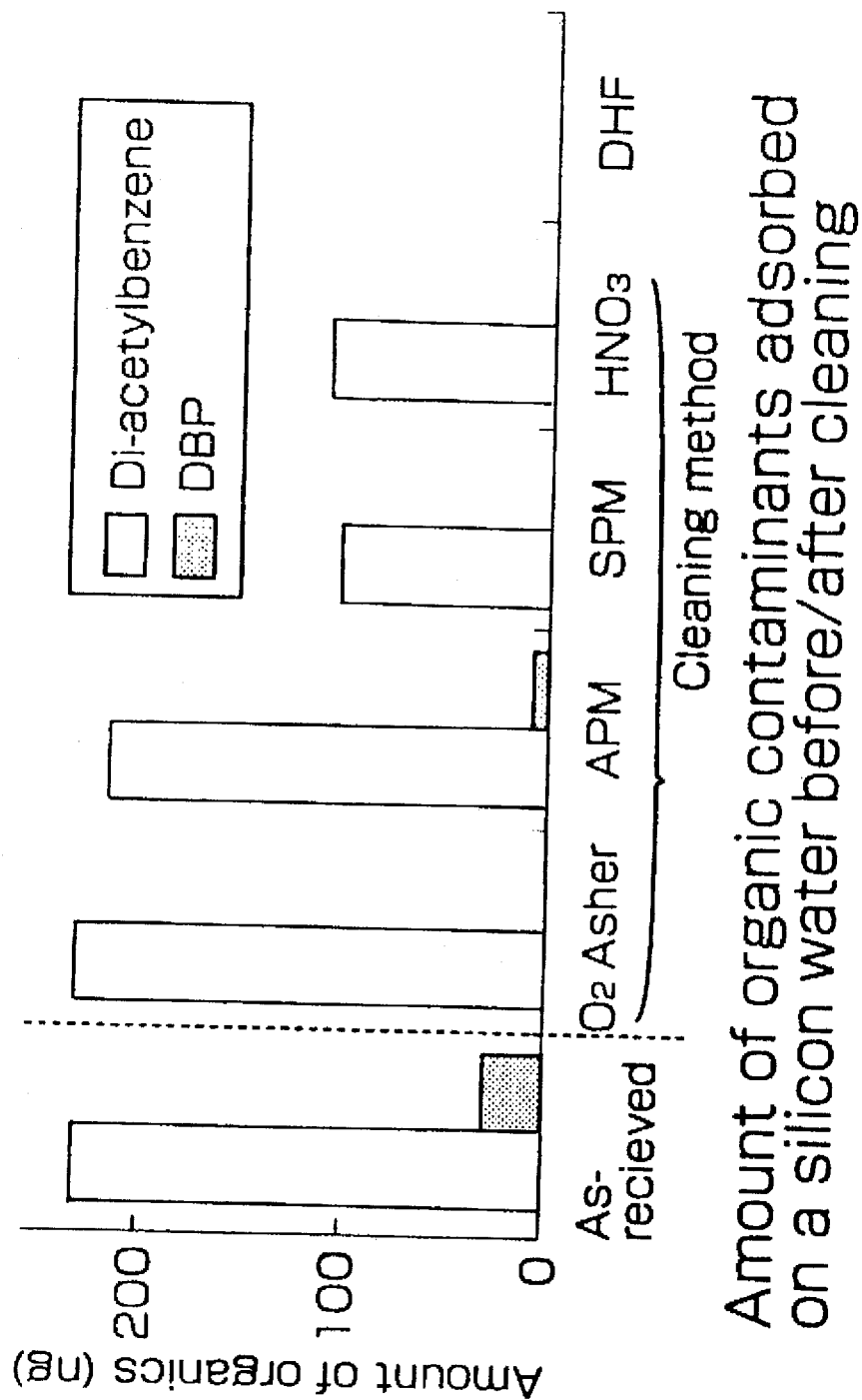
FIG. 4 is a graph comparing the cleaning effect of a substrate by the method of cleaning a silicon substrate according to embodiments of the present invention and the cleaning effect of the methods of cleaning according to the related art.

FIG. 2 is a flow chart of the method of cleaning a silicon substrate according to an embodiment of the present invention, FIGS. 3A to 3D are schematic cross-sectional views of the state of the surface of a substrate at the steps of the method of cleaning a silicon substrate according to an embodiment of the present invention, and FIG. 4 is a graph comparing the cleaning effect of a substrate by the method of cleaning a silicon substrate according to embodiments of the present invention and the cleaning effect of the methods of cleaning according to the related art.

FIRST EMBODIMENT

Next, a detailed explanation will be made of a first embodiment of the present invention.

Various contaminants are present on the surface of a silicon substrate before it is subjected to a film-forming, photolithographic, or other process. The state of adsorption of the contaminants is, for example, as shown in FIG. 3A. That is, a natural oxide film 13 containing metal impurities 14 is present on the surface of the silicon substrate 11. Further, organics 12 are adsorbed to that surface.

If the organics 12 are not removed in the first step of the cleaning of the surface of the silicon substrate, the surface will remain covered by the organics 12 and therefore it will be difficult to remove the heavy metals and other metal impurities 14 in the later steps.

Therefore, in this embodiment, as shown in FIG. 2, in the first step of the cleaning, that is, step 20, the silicon substrate is immersed in an aqueous solution of hydrofluoric acid. The aqueous solution of hydrofluoric acid has a concentration of hydrofluoric acid (HF) of 0.5 percent by weight (0.25M/liter) in this embodiment. The substrate is immersed for approximately 1 minute.

As a result of the treatment by hydrofluoric acid, as shown in FIG. 3B, the adsorbed organics 12 can be removed together with the natural oxide film 13. The metal impurities 14 remain on the surface of the silicon substrate.

An experiment was performed as follows to show that the impurities adsorbed on the surface of the silicon substrate could be substantially completely removed by the treatment by hydrofluoric acid.

The hydrofluoric acid-treated silicon substrate was heated to 400° C., the desorbed gas was condensed, and the content of the adsorbed organics was analyzed by gas chromatography and mass spectrophotometry (GC/MS). The results are shown in FIG. 4. In FIG. 4, the vertical axis shows the content of the diacetylbenzene and dibutyl phthalate (DBP).

The horizontal axis shows the methods of cleaning of the related art and present invention. As shown in FIG. 4, it was confirmed that the present invention enabled the approximately 210 ng content of the diacetylbenzene and the approximately 20 ng content of the dibutyl phthalate to be substantially completely removed.

As opposed to this, the related arts of $O_2$ Asher, cleaning by an aqueous solution of ammonia+hydrogen peroxide (APM), cleaning by an aqueous solution of sulfuric acid+ hydrogen peroxide (SPM), and cleaning by fuming nitric acid ($HNO_3$) were not able to completely remove the organics.

In the present embodiment, after the treatment by the hydrofluoric acid, the substrate is rinsed by pure water tow ash off the cleaning solution of the previous step at step 21 of FIG. 2, then is cleaned using an alkaline (ammonia+ hydrogen peroxide+pure water, etc.) cleaning solution for the purpose of removing particulates at step 22.

Next, at step 23, the substrate is rinsed and cleaned by pure water to wash off the cleaning solution of the previous step, then at step 24 it is cleaned using an acidic (hydrochloric acid+hydrogen peroxide+pure water etc.) cleaning solution. The cleaning by this acidic solution removes the metal impurities 14 from the surface of the silicon substrate 11 shown in FIG. 3B. However, the cleaning by the acidic solution, as shown in FIG. 3C, results in the formation of a clean natural silicon oxide film 15 on the surface of the silicon substrate 11.

Next, at step 25 shown in FIG. 2, the surface is rinsed and cleaned by pure water to wash off the cleaning solution of the previous step, then at step 26 hydrofluoric acid or buffered hydrofluoric acid is used to wet etch the substrate surface. This wet etching, as shown in FIG. 3D, enables the removal of the natural oxide film 15 formed on the surface of the silicon substrate by the cleaning solution. Next, at step 27 shown in FIG. 2, the surface of the silicon substrate is stripped of water and dried.

In the method of cleaning of a substrate according to this embodiment, since the first step of cleaning is to remove the natural oxide film formed on the surface of the substrate by hydrofluoric acid, it is possible to efficiently remove the minute amount of adsorbed organics adhering to the natural oxide film.

SECOND EMBODIMENT

Next, an explanation will be made of a second embodiment of the present invention.

The same procedure is followed as in the first embodiment to clean the silicon substrate except that use is made of buffered hydrofluoric acid instead of hydrofluoric acid at step 20 shown in FIG. 2. The buffered hydrofluoric acid used is an aqueous solution of 0.1 percent by weight of hydrofluoric acid and 60 percent by weight of ammonium fluoride. The substrate is immersed for approximately 1 minute.

In the same way as the case of the first embodiment, the content of the organics remaining on the surface of the silicon substrate after treatment by the buffered hydrofluoric acid was examined. As shown in FIG. 4, it was almost 0.

In the method of cleaning of a substrate according to this embodiment, since the first step of cleaning is to remove the natural oxide film formed on the surface of the substrate by buffered hydrofluoric acid, it is possible to efficiently remove the minute amount of adsorbed organics adhering to the natural oxide film.

THIRD EMBODIMENT

Next, an explanation will be made of a third embodiment of the present invention.

The same procedure is followed as in the first embodiment to clean the silicon substrate except that use is made of a vapor of hydrofluoric acid instead of a solution of hydrofluoric acid at step 20 shown in FIG. 2. The vapor of hydrofluoric acid used is obtained by heating an aqueous solution of 0.5 percent by weight of hydrofluoric acid (0.25M/liter). The temperature of the vapor is ordinary temperature and the pressure is ordinary pressure. The substrate is exposed to the vapor for 0.5 to approximately 1 minute.

In the same way as the case of the first embodiment, the content of the organics remaining on the surface of the silicon substrate after treatment by the vapor of hydrofluoric acid was examined. As shown in FIG. 4, it was almost 0.

In the method of cleaning of a substrate according to this embodiment, since the first step of cleaning is to remove the natural oxide film formed on the surface of the substrate by vapor of hydrofluoric acid, it is possible to efficiently remove the minute amount of adsorbed organics adhering to the natural oxide film.

FOURTH EMBODIMENT

Next, an explanation will be made of a fourth embodiment of the present invention.

The same procedure is followed as in the first embodiment to clean the silicon substrate except that use is made of a vapor of buffered hydrofluoric acid instead of the solution of hydrofluoric acid at step 20 shown in FIG. 2. The vapor of buffered hydrofluoric acid used is obtained by heating an aqueous solution of 0.1 percent by weight of hydrofluoric acid and 60 percent by weight of ammonium fluoride. The temperature of the vapor is ordinary temperature and the pressure is ordinary pressure. The substrate is exposed to the vapor for 0.5 to approximately 1 minute.

In the same way as the case of the first embodiment, the content of the organics remaining on the surface of the silicon substrate after treatment by the vapor of buffered hydrofluoric acid was examined. As shown in FIG. 4, it was almost 0.

In the method of cleaning of a substrate according to this embodiment, since the first step of cleaning is to remove the natural oxide film formed on the surface of the substrate by vapor of buffered hydrofluoric acid, it is possible to efficiently remove the minute amount of adsorbed organics adhering to the natural oxide film.

For example, the treatment performed at step 20 shown in FIG. 2 is not limited to treatment by immersing the substrate in a solution containing hydrofluoric acid or treatment by exposing the substrate in vapor containing hydrofluoric acid. Another treatment may be used so long as it enables the natural oxide film formed on the surface of the silicon substrate to be removed together with the organics on the surface.

As explained above, according to the present invention, it is possible to substantially completely remove the organics adsorbed on the surface of the substrate before cleaning and therefore possible to easily obtain a substrate with an excellent surface state. That is, the method of cleaning of the present invention enables one to obtain an extremely clean semiconductor wafer or other substrate, eliminates the contamination by the minute amount of organics in the subsequent film-forming, etching, exposure, or other processes, and thereby enables production of extremely high quality semiconductor devices with a good yield.

What is claim is:

1. A method of cleaning a surface of a substrate, wherein a first step of a process of cleaning the substrate comprises a step of removing a natural oxide film formed on the surface of the substrate, including, after the step of removing the natural oxide film, at least a second step of cleaning by an alkaline solution, a third step of cleaning by an acidic solution, and a fourth step of wet etching to remove an SiO film formed as a result of said third cleaning step, and wherein the alkaline solution comprises ammonia, hydrogen peroxide, and pure water.

2. A method of cleaning a substrate as set forth in claim 1, wherein the step of removing the natural oxide film comprises immersing the substrate in a solution containing hydrofluoric acid.

3. A method of cleaning a substrate as set forth in claim 2, wherein the hydrofluoric acid solution has a concentration of 0.5 percent by weight and wherein the time of immersion is approximately 1 minute.

4. A method of cleaning a substrate as set forth in claim 2, wherein solution containing hydrofluoric acid comprises a buffered hydrofluoric acid solution containing hydrofluoric acid and ammonium fluoride.

5. A method of cleaning a substrate as set forth in claim 4, wherein the buffered hydrofluoric acid comprises 0.1 percent by weight of hydrofluoric acid and 60 percent by weight of ammonium fluoride.

6. A method of cleaning a substrate as set forth in claim 1, wherein the step of removing the natural oxide film comprises exposing the substrate in a vapor containing hydrofluoric acid.

7. A method of cleaning a substrate as set forth in claim 6, wherein the vapor containing hydrofluoric acid comprises a vapor of buffered hydrofluoric acid containing hydrofluoric acid and ammonium fluoride.

8. A method of cleaning a substrate as set forth in claim 7, wherein said vapor of buffered hydrofluoric acid is formed by heating an aqueous solution of 0.1 percent by weight of hydrofluoric acid and 60 percent by weight of ammonium fluoride.

9. A method of cleaning a substrate as set forth in claim 8, wherein the pressure of the vapor of buffered hydrofluoric acid is made ordinary pressure.

10. A method of cleaning a substrate as set forth in claim 9, wherein the silicon substrate is exposed in the vapor containing the buffered hydrofluoric acid for 0.5 to approximately 1 minute.

11. A method of cleaning a substrate as set forth in claim 1, wherein said wet etching step is performed using hydrofluoric acid or buffered hydrofluoric acid.

12. A method of cleaning a substrate as set forth in claim 2, wherein said wet etching step is performed using hydrofluoric acid or buffered hydrofluoric acid.

13. A method of cleaning a substrate as set forth in claim 6, wherein said wet etching step is performed using hydrofluoric acid or buffered hydrofluoric acid.

* * * * *